(12) United States Patent
Alpago et al.

(10) Patent No.: US 9,739,847 B1
(45) Date of Patent: Aug. 22, 2017

(54) CIRCULAR VERTICAL HALL (CVH) SENSING ELEMENT WITH SIGNAL PROCESSING

(71) Applicant: Allegro Microsystems, LLC, Worcester, MA (US)

(72) Inventors: Octavio H. Alpago, Buenos Aires (AR); Ezequiel Alves, Buenos Aires (AR); Hernán D. Romero, Buenos Aires (AR)

(73) Assignee: Allegro MicroSystems, LLC, Worcester, MA (US)

( * ) Notice: Subject to any disclaimer, the term of this patent is extended or adjusted under 35 U.S.C. 154(b) by 74 days.

(21) Appl. No.: 15/012,125

(22) Filed: Feb. 1, 2016

(51) Int. Cl.
  *G01R 33/07* (2006.01)
  *G01D 5/14* (2006.01)
  *H02K 29/08* (2006.01)

(52) U.S. Cl.
  CPC ........... *G01R 33/077* (2013.01); *G01D 5/145* (2013.01); *H02K 29/08* (2013.01)

(58) Field of Classification Search
  CPC ........ G01D 5/142; G01D 5/145; G01R 33/06; H02K 29/08; H02P 6/16
  See application file for complete search history.

(56) References Cited

U.S. PATENT DOCUMENTS

| | | | |
|---|---|---|---|
| 4,668,914 A | 5/1987 | Kersten et al. |
| 4,761,569 A | 8/1988 | Higgs |
| 4,829,352 A | 5/1989 | Popovic et al. |
| 5,541,506 A | 7/1996 | Kawakita et al. |
| 5,572,058 A | 11/1996 | Biard |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |

(Continued)

FOREIGN PATENT DOCUMENTS

| DE | 10 2005 014 509 B4 | 10/2006 |
|---|---|---|
| DE | 10 2006 037 226 A1 | 2/2008 |

(Continued)

OTHER PUBLICATIONS

U.S. Appl. No. 15/012,131, filed Feb. 1, 2016, Alpago, et al.
(Continued)

*Primary Examiner* — Son Le
*Assistant Examiner* — Dustin Dickinson
(74) *Attorney, Agent, or Firm* — Daly, Crowley, Mofford & Durkes, LLP

(57) ABSTRACT

A magnetic field sensor comprises a circular vertical Hall (CVH) sensing element having a plurality of vertical Hall elements. A CVH output stage is included comprising one or more of drive circuits to drive the plurality of vertical Hall elements and produce an analog signal representing a strength of an external magnetic field as detected by the plurality of vertical Hall elements. An analog-to-digital converter is coupled to receive the analog signal and produce a digital signal. A quadrature modulator circuit is coupled to the digital signal and operable to generate a plurality of quadrature modulated signals. A processor stage receives signals representative of the plurality of quadrature modulated signals and computes an estimated angle of the external magnetic field.

23 Claims, 9 Drawing Sheets

(56) References Cited

U.S. PATENT DOCUMENTS

| | | | |
|---|---|---|---|
| 5,694,038 | A | 12/1997 | Moody et al. |
| 5,831,513 | A | 11/1998 | Lue |
| 5,844,411 | A | 12/1998 | Vogt |
| 5,942,895 | A | 8/1999 | Popovic et al. |
| 6,064,199 | A | 5/2000 | Walter et al. |
| 6,064,202 | A | 5/2000 | Steiner et al. |
| 6,091,239 | A | 7/2000 | Vig et al. |
| 6,100,680 | A | 8/2000 | Vig et al. |
| 6,166,535 | A | 12/2000 | Irle et al. |
| 6,232,768 | B1 | 5/2001 | Moody et al. |
| 6,236,199 | B1 | 5/2001 | Irle et al. |
| 6,265,864 | B1 | 7/2001 | De Winter et al. |
| 6,288,533 | B1 | 9/2001 | Haeberli et al. |
| 6,297,627 | B1 | 10/2001 | Towne et al. |
| 6,356,741 | B1 | 3/2002 | Bilotti et al. |
| 6,525,531 | B2 | 2/2003 | Forrest et al. |
| 6,542,068 | B1 | 4/2003 | Drapp et al. |
| 6,545,462 | B2 | 4/2003 | Schott et al. |
| 6,622,012 | B2 | 9/2003 | Bilotti et al. |
| 6,768,301 | B1 | 7/2004 | Hohe et al. |
| 6,969,988 | B2 | 11/2005 | Kakuta et al. |
| 7,030,606 | B2 | 4/2006 | Kato et al. |
| 7,038,448 | B2 | 5/2006 | Schott et al. |
| 7,085,119 | B2 | 8/2006 | Bilotti et al. |
| 7,119,538 | B2 | 10/2006 | Blossfeld |
| 7,159,556 | B2 | 1/2007 | Yoshihara |
| 7,235,968 | B2 | 6/2007 | Popovic et al. |
| 7,259,556 | B2 | 8/2007 | Popovic et al. |
| 7,307,824 | B2 | 12/2007 | Bilotti et al. |
| 7,362,094 | B2 | 4/2008 | Voisine et al. |
| 7,714,570 | B2 | 5/2010 | Thomas et al. |
| 7,746,065 | B2 | 6/2010 | Pastre et al. |
| 7,759,929 | B2 | 7/2010 | Forsyth |
| 7,872,322 | B2 | 1/2011 | Schott et al. |
| 7,911,203 | B2 | 3/2011 | Thomas et al. |
| 7,965,076 | B2 | 6/2011 | Schott |
| 7,994,774 | B2 | 8/2011 | Thomas et al. |
| 8,729,890 | B2 | 5/2014 | Donovan et al. |
| 8,890,518 | B2 | 11/2014 | Daubert |
| 2004/0046553 | A1* | 3/2004 | Leger .......... G01R 33/24 324/304 |
| 2006/0011999 | A1 | 1/2006 | Schott et al. |
| 2009/0121707 | A1 | 5/2009 | Schott |
| 2009/0174395 | A1 | 7/2009 | Thomas et al. |
| 2010/0156397 | A1 | 6/2010 | Yabusaki et al. |
| 2010/0164491 | A1 | 7/2010 | Kejik et al. |
| 2011/0248708 | A1 | 10/2011 | Thomas et al. |
| 2015/0176964 | A1 | 6/2015 | Uberti et al. |
| 2015/0241523 | A1* | 8/2015 | Scherr .......... G01R 33/0023 324/244 |
| 2016/0305795 | A1* | 10/2016 | Eisenbeis .......... G01D 7/007 |

FOREIGN PATENT DOCUMENTS

| | | |
|---|---|---|
| EP | 0 631 416 B1 | 12/1994 |
| EP | 0 875 733 B1 | 12/1994 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056829 A1 | 6/2006 |
| WO | WO 2006/074989 A2 | 7/2006 |
| WO | WO 2008 145662 A1 | 12/2008 |
| WO | WO 2009/124969 A1 | 10/2009 |
| WO | WO2013/134255 A1 | 9/2013 |
| WO | WO 2014/126670 A1 | 8/2014 |

OTHER PUBLICATIONS

U.S. Appl. No. 15/012,142, filed Feb. 1, 2016, Alpago, et al.

Banjevic; "High Bandwidth CMOS Magnetic Sensors Based on the Miniaturized Circular Vertical Hall Device;" Sep. 2011; 153 pages.

Drljaca, et al.; "Nonlinear Effects in Magnetic Angular Position Sensor With Integrated Flux Concentrator;" Proc 23$^{rd}$ International Conference on Microelectronics (MIEL 2002); vol. 1; NIS; Yugoslavia; May 12-15, 2002; pp. 223-226; 4 pages.

Melexis MLX 90324; ""Under-the-Hood" Triaxis Rotary Position feat. SENT Protocol;" 3901090324 Data Sheet; Dec. 2008; 40 pages.

Petrie; "Circular Vertical Hall Magnetic Field Sensing Element and Method with a Plurality of Contnuous Output Signals;" U.S. Appl. No. 13/035,243, filed Feb. 25, 2011; 56 pages.

Meher et al.: "50 Years of CORDIC: Algorithms, Architectures, and Applications", IEEE Transactions on Circuits and Systems; vol. 56, No. 9, Sep. 2009; p. 1893-1907 (15 pages).

Andraka, Ray: "A survey of CORDIC algorithms for FPGA based computers"; FPGA-1998, Montgomery, CA; (10 pages).

U.S. Appl. No. 15/012,125, filed Feb. 1, 2016, Alpago, et al.

Allegro Microsystems, Inc.; "High Precision Linear Hail Effect Sensor IC with a Push/Pull, Pulse Width Modulated Output;" A1351; pp. 1-23; 23 pages.

Allegro Microsystems, Inc. "High Precision 2-Wire Linear Hall Effect Sensor IC with a Pulse Width Modulated Output" A1354; pp. 1-22; 22 pages.

Allegro Microsystems, Inc.; "High Precision Linear Hall-Effect Sensor with an Open Drain Pulse Width Modulated Output;" A1356; pp. 1-20; 20 pages.

Allegro Microsystems, Inc.; "Low- Noise Prograinmable Linear Hail Effect Sensor ICS with Adjustable Bandwidth (50 kHz Maximum) and Analog Output;" A1360, A1361 and A1362; pp. 1-25; 25 pages.

Baschirotto et el.; "Development and Analysis of a PCB Vector 2-D Magnetic Field Sensor System for Electronic Compasses;" IEEE Sensors Journai, vol. 6, No. 2; Apr. 2006; pp. 365-371; 7 pages.

Kejik, et al.; "Purley CMOS Angular Position Sensor Based on a New Hall Microchip;" 34$^{th}$ Annual Conference of IEEE Industrial Electronics; IECON; Nov. 10-13, 2008; pp. 1777-1781; 5 pages.

Kejik.,et al.; "Ultra Low-Power Angular Position Sensor for High-Speed Portable Applications;" 2009 IEEE Sensors Conference; Oct. 25-28, 2009; pp. 173-178; 4 pages.

Reymond, et al.; "True 2D CMOS Integrated Hall Sensor;" 2007 IEEE Sensors Conference; Oct. 28-31, 2007; pp. 860-863; 4 pages.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with I²C interface;" Aug. 14, 2008; 9 pages.

MEMSIC Corporation; MMC314xMS; "Ultra Small 3-axis Magnetic Sensor, with I²C Interface;" Mar. 31, 2010; 8 pages.

Micronas GmbH; "HAL® 3625 Programrnable Direct Angle Sensor;" Product Information; Sep. 2009; 2 pages.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880 ; 4 pages.

PCT Search Report and Written Opinion dated Apr. 19, 2017 for PCT Appl. No. PCT/US2017/014060; 13 pages.

(56) References Cited

OTHER PUBLICATIONS

PCT Search Report and Written Opinion dated Apr. 19, 2017 for PCT Appl. No. PCT/US2017/014064; 12 pages.
PCT Search Report and Written Opinion dated Apr. 2017 for PCT Appl. No. PCT/US2017/014081; 12 pages.
Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11; 11 pages.
Allegro Microsystems, Inc.; "A1174 Data Sheet; Ultrasensitive Hall Effect Latch with Internally or Externally Controlled Sample and Sleep Periods for Track Ball and Scroll Wheel Applications;" published Jul. 25, 2008; pp. 1-13; 13 pages.
Allegro Microsystems, Inc.; "A1230 Data Sheet: Ultra-Sensitive Dual-Channel Quadrature Hall-Effect Bipolar Switch;" published Mar. 26, 2010; 16 sheets.
Allegro Microsystems, Inc.; "A1351 Data Sheet: High Precision Linear Hall Effect Sensor with a Push/Pull, Pulse Width Modulated Output;" published Mar. 7, 2008; pp. 1-23; 23 pages.
Allegro Microsystems, Inc.; "A1360, A1361 and A1362 Data Sheet: Low-Noise Programmable Linear Hall Effect Sensors with Adjustable Bandwidth (50 $kHz$ Maximum) and Analog Output;" published Mar. 18, 2008; pp. 1-25; 25 pages.
Allegro, Microsystems, Inc.; "A3212 Data Sheet: Micropower, Ultra-Sensitive Hall-Effect Switch;" published Sep. 22, 2004; pp. 1-12; 12 pages.
Allegro Microsystems, Inc.; "ATS675LSE Data Sheet: Self-Calibrating TPOS Speed Sensor Optimized for Automotive Cam Sensing Applications;" published Jul. 11, 2008; pp. 1-13; 13 pages.
Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40; 40 pages.
Allegro Microsystems, Inc.; "3235 Data Sheet 27633A, Dual-Output Hall-Effect Switch;" http://www.datahseetcatalog.org/datasheets/90/205047_DS.pdf; downloaded Sep. 29, 2010; 6 sheets.
Allegro Microsystems, Inc.; "A3425 Data Sheet: Dual, Chopper-Stabilized, Ultra-Sensitive Bipolar Hall-Effect Switch;" published Jun. 28, 2002; pp. 1-10; 10 pages.
Atherton et al.; "Sensor Signal Conditioning—an IC Designer's Perspective;" IEEE Electro International; Apr. 26-28, 1991; pp. 129-134; 6 pages.
Austria Microsystems; "AS5040 datasheet; 10-Bit Programmable Magnetic Rotary Encoder;" Revision 1.1; Jan. 2004; pp. 1-20; 20 pages.
Banievic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880 ; 4 pages.
Blanchard et al.; "Cylindrical Hall Device;" International Electron Devices Meeting; Dec. 8-11, 1996; pp. 541-544; 4 pages.
Burger et al.; "New fully integrated 3-D silicon Hall sensor for precise angular-position measurements;" Sensors and Actuators, A 67; May 1998; pp. 72-76; 5 pages.
Dwyer; Allegro Microsystems, Inc.; "AN296061 Data Sheet: Ring Magnet Speed Sensing for Electronic Power Steering;" published Jul. 21, 2009; pp. 1-4.
Freitas et al.; "Giant magnetoresistive sensors for rotational speed control;" Jorunal of Applied Physics, vol. 85, No. 8; Apr. 15, 1999; pp. 5459-5461; 3 pages.
Gilbert; "Technical Advances in Hall-Effect Sensing;" Allegro Microsystems, Inc. Product Description; May 10, 2006; 7 sheets.
Häberli et al.; "Contactless Angie Measurements by CMOS Magnetic Sensor with On Chip Read-Out Circuit;" The 8$^{th}$ International Conference on Solid-State Sensors and Actuators and Eurosensors IX; Jan. 25-29, 1995; pp. 134-137; 4 pages.
Häberli et al.; "Two-Dimensional Magnetic Microsensor with On-Chip Signal Processing for Contactless Angle Measurement;" IEEE Journal of Solid-State Clrcuits, vol. 31, No. 12; Dec. 1996; pp. 1902-1907; 6 pages.
Hiligsmann et al.; "Monolithic 360 Degrees Rotary Position Sensor IC;" 2004 IEEE Proceedings of Sensors, vol. 3; Oct. 24-27, 2004; pp. 1137-1142; 6 pages.
Kejik et al.; "Circular Hall Transducer for Angular Position Sensing;" Internationai Soiid-State Sensors, Actuators and Microsystems Conference; Transducers; Jun. 2007; pp. 2593-2596; 4 pages.
Lou Law; "Angle Position Sensing with 2-Axis Hall ICs;" Sensors Magazine, vol. 20, No. 3; Mar. 2003; 7 sheets.
Masson et al.; "Multiturn and high precision through-shaft magnetic sensors;" Sensor + Text Conference; Proceedings II; May 2009; pp. 41-46; 6 pages.
Metz et al; "Contactless Angle Measurement Using Four Hall Devices on Single Chip;"; International Conference on Solid State Sensors and Actuators; Transducers; vol. 1; Jun. 16-19, 1997; pp. 385-388, 4 pages.
Munter; "A Low-offset Spinning-current Hall Plate;" Sensors and Actuators, vol. A21-A23; Jan. 1990; pp. 743-746; 4 pages.
Novotechnik Siedle Group; "How New Angular Positioning Sensor Technology Opens a Broad Range of New Applications;" Vert-X Technology; Dec. 2001; pp. 1-5.
Paranjape et al.; "A CMOS-compatible 2-D vertical Hall magnetic-field sensor using active carrier confinement and post-process micromachining;" The 8$^{th}$ International Conference on Solid-State Sensors and Acutators, Physical vol. 53, Issues 1-3; May 1996; pp. 278-283, 6 pages.
Petoussis et al.; "A Novel Hall Effect Sensor Using Elaborate Offset Cancellation Method;" Sensors & Transducers Journal, vol. 100, Issue 1; Jan. 2009; pp. 85-91; 7 pages.
Popovic; "Not-plate-like Hall magnetic sensors and their applications;" Sensors and Actuators A: Physical, vol. 85, Issues 1-3; Aug. 2000; pp. 9-17; 9 pages.
Roumenin et al.; "Verticai Hall Effect Devices in the Basis of Smart Silicon Sensors;" IEEE Workshop on Intelligent Data Acquisition and Advanced Computing Systems: Technology and Applications; Sep. 5-7, 2005; pp. 55-58; 4 pages.
Roumenin; "Magnetic sensors continue to advance towards perfection;" Sensors and Actuators A: Physical, vol. 46-47, Issues 1-3; Jan.-Feb. 1995; pp. 273-279; 7 pages.
Schneider et al.; "Temperature Calibration of CMOS Magnetic Vector Probe for Contactless Angle Measurement System;" International Electron Devices Meeting; Dec. 8-11, 1996; pp. 533-538; 4 pages.
SENSIMA technoiogy sa; "CVHD: a new concept of Angular Position Sensor;" Slide Presentation for Allegro Microsystems; Mar. 2009; 17 sheets.
Sentron; AN-101; "Angular position sensing with 2-Axis Hall IC 2SA-10;" Feb. 12, 2004; http://www.diegm.uniud.it/petrella/Azionamenti%20Elettrici%20ll/Sensori%20e%20trasduttori/Data%20Sheet%20-%202SA-10.pdf; pp. 1-7.
van der Meer: et al; "CMOS quad spinning-current Hall-sensor system for compass application;" IEEE Proceedings of Sensors, vol. 3; Oct. 24-27, 2004; pp. 1434-1437; 4 pages.
Vogelgesang et al.; Robert Bosch GmbH; "GMR sensors in automotive application;" CS-SNS/ECS Slides Presentation; Mar. 2, 2005; 16 sheets.
Volder; "The CORDIC Trigonometric Computing Technique;" The Institute of Radio Engineers, Inc.; IRE Transactions on Electronic Computers, vol. EC, Issue 3; Sep. 1959; pp. 226-230; 5 pages.

\* cited by examiner

CIRCULAR VERTICAL HALL (CVH) SENSING ELEMENT WITH SIGNAL PROCESSING

FIELD OF THE INVENTION

This invention relates generally to electronic circuits, and, more particularly, to an electronic circuit that can process signals from a circular vertical Hall (CVH) sensing element to determine an angle of a magnetic field using particular processing techniques.

BACKGROUND OF THE INVENTION

Sensing elements are used in a variety of applications to sense characteristics of an environment. Sensing elements include, but are not limited to, pressure sensing elements, temperature sensing elements, light sensing elements, acoustic sensing elements, and magnetic field sensing elements.

A magnetic field sensor can include one or more magnetic field sensing elements and also other electronics.

Magnetic field sensors can be used in a variety of applications. In one application, a magnetic field sensor can be used to detect a direction of a magnetic field. In another application, a magnetic field sensor can be used to sense an electrical current. One type of current sensor uses a Hall effect magnetic field sensing element in proximity to a current-carrying conductor.

Planar Hall elements and vertical Hall elements are known types of magnetic field sensing elements that can be used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

SUMMARY OF THE INVENTION

In an embodiment, a magnetic field sensor comprises a circular vertical Hall (CVH) sensing element having a plurality of vertical Hall elements. Each vertical Hall element is comprised of a respective group of vertical Hall element contacts selected from among a plurality of vertical Hall element contacts, the plurality of vertical Hall element contacts arranged over a common implant region in a semiconductor substrate, where adjacent ones of the plurality of contacts are arranged at predetermined angles from each other. A CVH output stage is included comprising one or more of drive circuits to drive the plurality of vertical Hall elements and produce an analog signal representing a strength of an external magnetic field as detected by the plurality of vertical Hall elements. An analog-to-digital converter is coupled to receive the analog signal and produce a digital signal. A quadrature modulator circuit is coupled to the digital signal and operable to generate a plurality of quadrature modulated signals. A processor stage receives signals representative of the plurality of quadrature modulated signals and computes an estimated angle of the external magnetic field.

One or more of the following features may be included.

The estimated angle may have an accuracy greater than the predetermined angle between the vertical Hall element contacts. The analog-to-digital converter may be a sigma-delta analog-to-digital converter and the digital signal is a pulse stream. The sigma-delta analog-to-digital converter comprises a noise shaping transform that shifts quantization noise to higher frequencies.

The quadrature modulator circuit may be configured to modulate the digital signal with a sine signal to produce a first quadrature modulated signal of the plurality of quadrature modulated signals. The quadrature modulator circuit may be configured to modulate the digital signal with the sine signal by multiplying the digital signal with a clock or square wave signal. The quadrature modulator circuit may be configured to modulate the digital signal with a cosine signal to produce a second quadrature modulated signal of the plurality of quadrature modulated signals. The quadrature modulator circuit may be configured to modulate the digital signal with the sine signal by multiplying the digital signal with a first clock or square wave signal and configured to modulate the digital signal with a cosine signal by multiplying the digital signal with a second clock or square wave signal that is ninety degrees out of phase with the first clock signal.

The processor stage may be configured to filter the first and second quadrature signals. The processor stage may be configured to filter the first and second quadrature signals by performing an integration using the first and second quadrature signals.

The CVH sensing element may further comprise a drive circuit and a switching network having a plurality of connection nodes, wherein a portion of the plurality of connections are coupled to the drive circuit to drive the vertical Hall elements coupled to the connection nodes. The processor stage may be configured to perform a sliding integration to produce at least one estimated angle output per CVH cycle.

In another embodiment, method of sensing an angle of a magnetic field comprises selectively activating one or more drive circuits coupled to one or more of a plurality of vertical Hall elements arranged over a common implant region in a substrate, where each vertical Hall element is comprised of a respective group of vertical Hall element contacts selected from among a plurality of vertical Hall element contacts, the plurality of vertical Hall element contacts arranged over a common implant region in a semiconductor substrate, adjacent ones of the plurality of contacts at predetermined angles from each other, the selectively activating in order to activate the one or more of the plurality of vertical Hall elements. An analog signal may be provided from the one or more activated vertical Hall elements, the signal representing a magnitude of an external magnetic field as detected by the one or more vertical hall elements. The analog signal may be converted to a digital signal. A plurality of quadrature modulated signals may be generated. An estimated angle of the external magnetic field may be computed using the plurality of quadrature modulated signals.

One or more of the following features may be included.

The estimated angle may have an accuracy greater than the predetermined angle between the vertical Hall element contacts. Converting the analog signal may include using a sigma-delta analog-to-digital converter to produce an N-bit output stream.

Noise in the analog signal may be shifted to higher frequencies. Shifting the noise may include converting the analog output stream to the digital signal by processing the signal with a sigma-delta analog-to-digital converter having a noise shaping property.

The digital signal may be modulated with a sine signal to produce a first quadrature modulated signal. Modulating the digital signal with a sine signal may include multiplying the digital signal with a clock or square wave signal. The digital signal may be modulated with a cosine signal to produce a second quadrature modulated signal. Modulating the digital signal with a cosine signal may include multiplying the digital signal with a clock or square wave signal that is ninety degrees out of phase with the sine signal.

The method may comprise filtering the first and second quadrature signals. Filtering the first and second quadrature signals may include performing an integration using the first and second quadrature signals.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
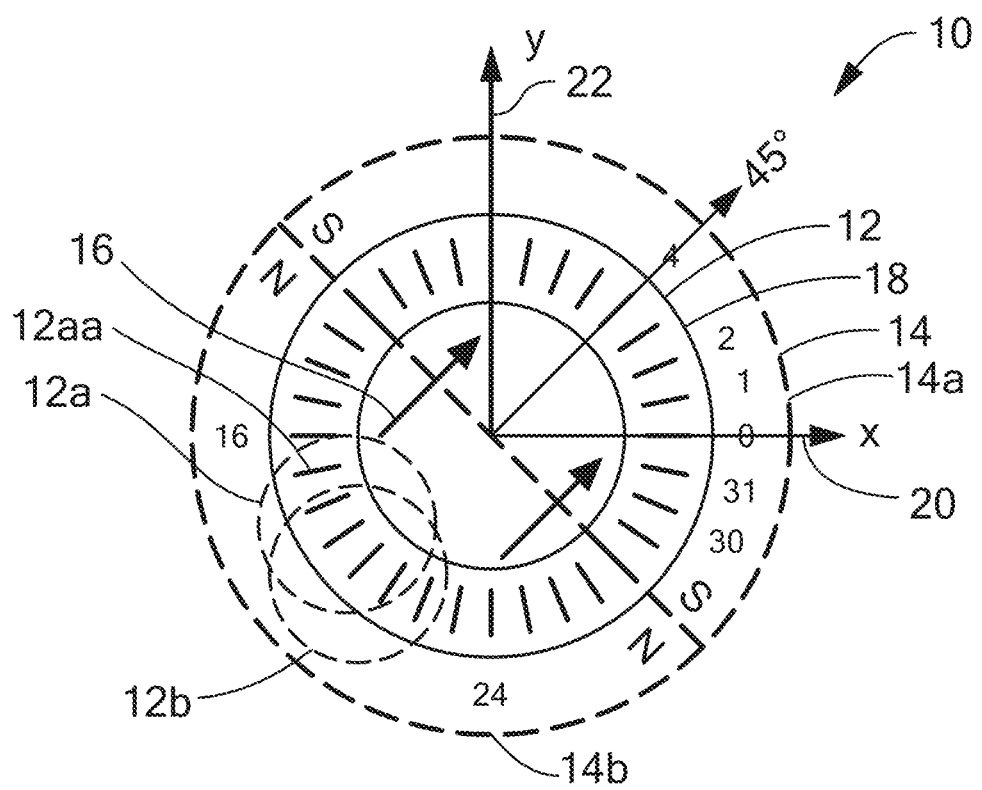
FIG. 1 is a pictorial showing a circular vertical Hall (CVH) sensing element having a plurality of vertical Hall elements arranged in a circle over a common implant region and a two pole magnet disposed close to the CVH sensing element.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

As is known in the art, magnetic fields have direction and strength. The strength of a magnetic field can be described as a magnitude of a magnetic flux or flux density. Therefore, the terms magnetic field "strength" and magnetic "flux" may be used interchangeably in this document.

As used herein, the term "ground" refers to a reference potential in an electrical circuit from which other voltages are measured, or a common return path for electrical current. Ground may also refer to a portion of a circuit that is connected to earth ground.

Referring to FIG. 1, a circular vertical Hall (CVH) sensing element 12 includes a common circular implant region 18 having a plurality of vertical Hall elements disposed thereon, of which a vertical Hall element 12a is but one example. Each vertical Hall element has a plurality of Hall element contacts (e.g., four or five contacts), of which a vertical Hall element contact 12aa is but one example.

The term "common" circular implant region indicates that the plurality of vertical Hall elements of the CVH sensing element can have no diffused barriers between the plurality of vertical Hall elements.

A particular vertical Hall element (e.g., 12a) within the CVH sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the example shown in FIG. 1, there are thirty-two vertical Hall elements and thirty-two vertical Hall element contacts. However, a CVH sensing element can have more than or fewer than thirty-two vertical Hall elements and more than or fewer than thirty-two vertical Hall element contacts.

In some applications, a circular magnet 14 having a south side 14a and a north side 14b can be disposed over the CVH sensing element 12. The circular magnet 14 may generate a magnetic field 16 having a direction from the north side 14b to the south side 14a, here shown to be pointed to a direction of about forty-five degrees relative to x-axis 20. Other magnets having other shapes and configurations are possible.

In some applications, the circular magnet 14 is mechanically coupled to a rotating object (a target object), for example, an automobile crankshaft or an automobile camshaft, and is subject to rotation relative to the CVH sensing element 12. With this arrangement, the CVH sensing element 12 in combination with an electronic circuit described below can generate a signal related to the angle of rotation of the magnet 14.

Figure 2:
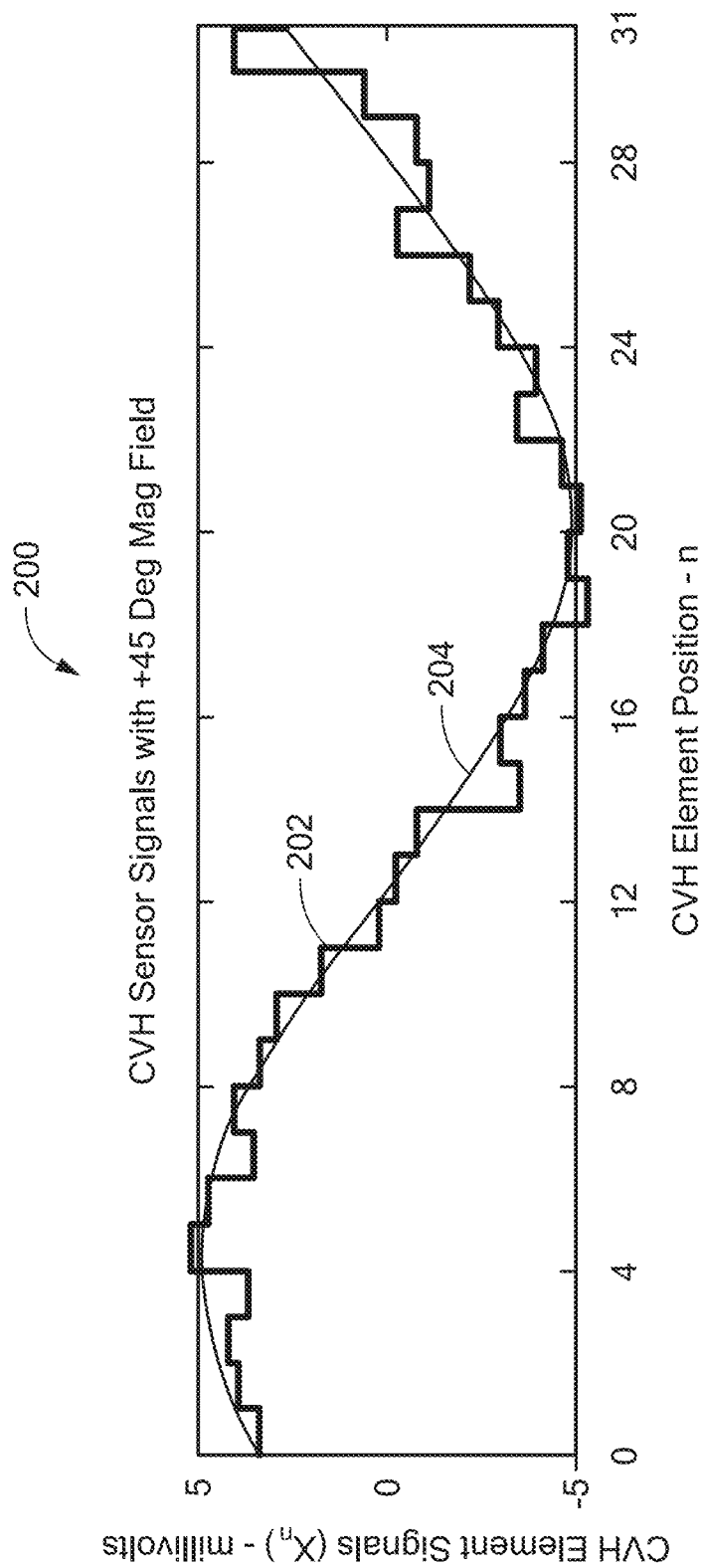
FIG. 2 is a graph showing an output signal as may be generated by the CVH sensing element of FIG. 1.

Referring now to FIG. 2, a graph 200 has a horizontal axis with a scale in units of CVH vertical Hall element position, n, around a CVH sensing element, for example, the CVH sensing element 12 of FIG. 1. The graph 200 also has a vertical axis with a scale in units of amplitude in units of millivolts. The vertical axis is representative of output signal levels from the plurality of vertical Hall elements of the CVH sensing element.

The graph 200 includes a signal 202 representative of output signal levels from the plurality of vertical Hall elements of the CVH taken sequentially with the magnetic field 16 of FIG. 1 stationary and pointing in a direction of forty-five degrees.

The graph 200 shows one CVH sensing element cycle, i.e. one revolution of the CVH sensing element where each Hall element is activated in sequence around the circumference of the CVH sensing element. For example, the portion of signal 202 shown in graph 200 is produced during one CVH cycle as each of the Hall elements are activated around the circumference of the CVH sensing element. In this example, the CVH cycle starts with Hall element position 0, and ends with Hall element position 31. Of course, in this example, a CVH cycle can have any start and end point as long as the CVH cycle includes one revolution of the CVH sensing element.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field 16. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field 16.

A sine wave 204 is provided to more clearly show the ideal behavior of the signal 202. The signal 202 has variations due to vertical Hall element offsets, which tend to somewhat randomly cause element output signals to be too high or too low relative to the sine wave 204, in accordance with offset errors for each element. In embodiments, the offset signal errors may be undesirable. In some embodiments, the offset errors can be reduced by "chopping" each vertical Hall element. Chopping will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset. Chopping is described more fully in U.S. Pat. No. 8,890,518 (filed Jun. 8, 2011), which is incorporated here by reference in its entirety.

Full operation of the CVH sensing element 12 of FIG. 1 and generation of the signal 202 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662, and is incorporated here by reference.

As will be understood from PCT Patent Application No. PCT/EP2008/056517, groups of contacts of each vertical Hall element can be used in a multiplexed or chopped arrangement to generate chopped output signals from each vertical Hall element. Thereafter, a new group of adjacent vertical Hall element contacts can be selected (i.e., a new vertical Hall element), which can be offset by one or more elements from the prior group. The new group can be used in the multiplexed or chopped arrangement to generate another chopped output signal from the next group, and so on.

Each step of the signal 202 can be representative of a chopped output signal from one respective group of vertical Hall element contacts, i.e., from one respective vertical Hall element. However, in other embodiments, no chopping is performed and each step of the signal 202 is representative of an unchopped output signal from one respective group of vertical Hall element contacts, i.e., from one respective vertical Hall element. Thus, the graph 502 is representative of a CVH output signal with or without the above-described grouping and chopping of vertical Hall elements.

It will be understood that, using techniques described above in PCT Patent Application No. PCT/EP2008/056517, a phase of the signal 502 (e.g., a phase of the signal 204) can be found and can be used to identify the pointing direction of the magnetic field 16 of FIG. 1 relative to the CVH sensing element 12.

Figure 3:
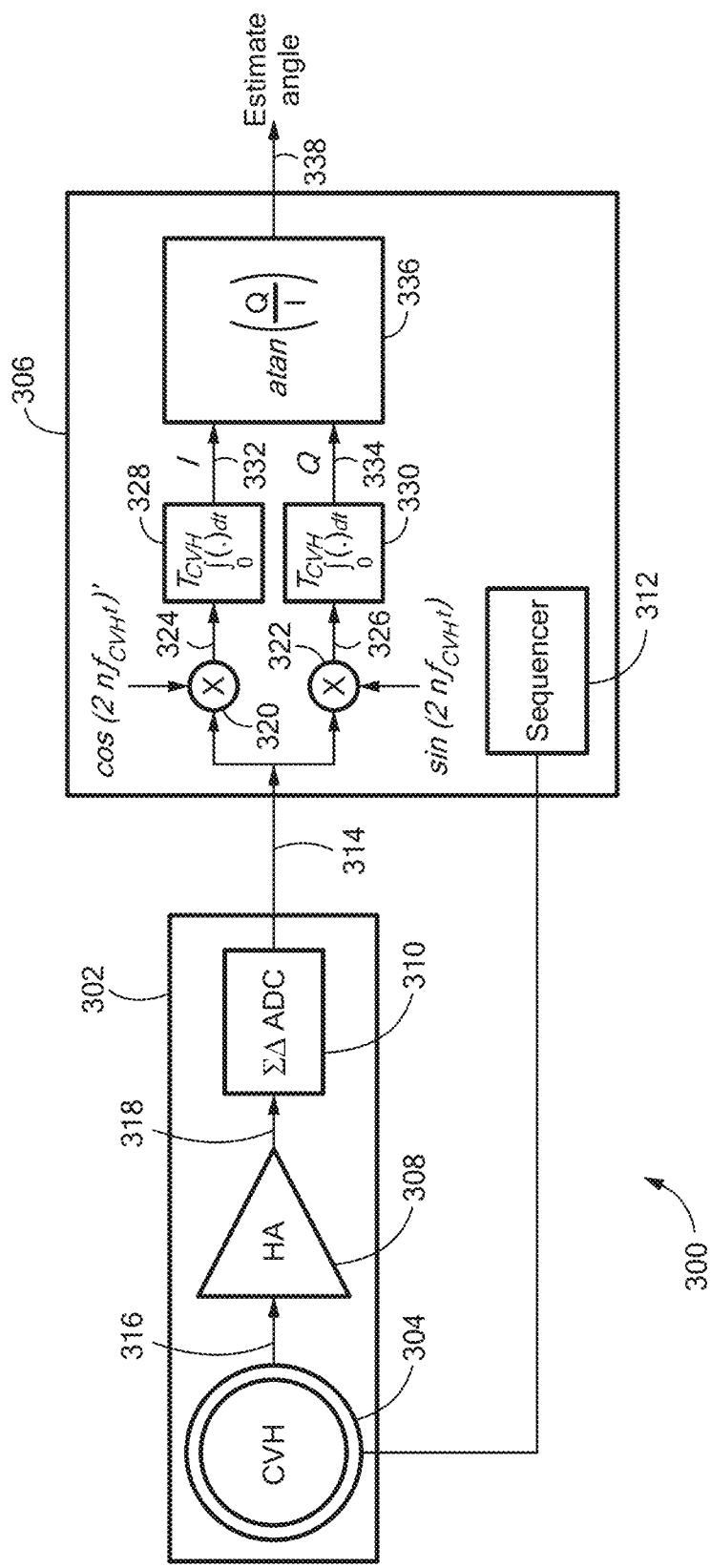
FIG. 3 is a block diagram of a magnetic field sensor having a CVH sensing element, having an analog-to-digital converter and a processor circuit that can include an integrator circuit.

Referring now to FIG. 3 a magnetic field sensor 300 includes a sensing portion 302 and a signal processing portion 306. The sensing portion 302 can include (among other things) a CVH sensing element 304, an amplifier 308, and an analog-to-digital converter ("ADC") 310. CVH sensing element 304 may be the same as or similar to CVH sensing element 12 in FIG. 1. In some embodiments there are thirty-two vertical Hall elements in the CVH sensing element 304 and a corresponding thirty-two CVH sensing element contacts. In other embodiments there are sixty-four vertical Hall elements in the CVH sensing element 304 and a corresponding sixty-four CVH sensing element contacts. In yet other embodiments, any number of vertical Hall elements and CVH sensing element contacts may be employed.

One skilled in the art will recognize that the grouping of elements into sensing portion 302 and signal processing portion 306 are arbitrary groupings made for the purposes of illustration. In embodiments, the elements can be grouped or not grouped in any way.

In embodiments, ADC 310 is a sigma-delta converter and converted signal 314 is a delta-modulated waveform (e.g. a bit-stream) representing the output of CVH sensing element 304. For example, recalling that signal 202 in FIG. 2 represents the output of CVH sensing element 10 under certain circumstances, converted signal 314 could be a delta-modulated version of signal 202 and may also represent the output of a CVH sensing element such as CVH sensing element 304.

A magnet (not shown) can be disposed proximate to the CVH sensing element 304, and can be coupled to a target object (not shown). The magnet can be the same as or similar to the magnet 14 of FIG. 1.

Magnetic field sensor 300 may be configured to detect the position, rotational angle, speed, direction, and/or other states of a rotating magnetic target by, for example, measuring and processing the phase and changes in phase of converted signal 314.

As described above, the CVH sensing element 304 can have a plurality of vertical Hall elements, each vertical Hall element comprising a group of vertical Hall element contacts (e.g., five vertical Hall element contacts), of which the vertical Hall element contact is but one example.

In some embodiments, sequencer circuit 312 can control CVH sensing element 304 by switching individual vertical Hall elements and contacts on and off to provide sequential CVH differential output signal 316.

In certain embodiments, output signal 316 is a differential signal. In other embodiments, output signal 316 may be a non-differential signal.

The CVH output signal 316 may be comprised of sequential output signals taken one-at-a-time around the CVH sensing element 304, where each output signal is generated on a separate signal path and switched by the sequencer circuit 312 into the path of output signal 316. The CVH output signal 316 can be represented as a switched set of CVH output signals $x_n=x_0$ to $x_{N-1}$, taken one at a time, where n is equal to a vertical Hall element position (i.e., a position of a group of vertical Hall element contacts that form a vertical Hall element) in the CVH sensing element 304, and where there are N such positions.

Signal processing portion 306 may employ a quadrature modulation processing scheme to detect phase and phase changes in converted signal 314. Signal processing portion 306 may include a first modulator circuit 320 and a second modulator circuit 320. The modulator circuits 320 and 322 may modulate signal 314 to produce modulated signal 324 and modulated signal 326 respectively. Taken together, the modulators 320, 322 are referred to here as an I/Q modulator or as a quadrature modulator circuit.

In an embodiment, modulated signal 324 and modulated signal 326 may be ninety degrees out of phase from each other. For example, modulator circuit 320 may modulate converted signal 314 by applying (e.g. multiplying by) a cosine signal and modulator circuit 322 may modulate converted signal 314 by applying (e.g. multiplying by) a sine signal. Because sine and cosine are ninety degrees out of phase, the resulting modulated signals 324 and 326 may be quadrature signals that are ninety degrees out of phase.

In an alternate embodiment, modulator 320 may modulate converted signal 314 by multiplying with a first clock signal or square wave that represents the cosine function, and modulator 322 may modulate converted signal 314 by multiplying with a second clock signal or square wave that represents the sine signal. The first and second clock signals/square waves may be ninety degrees out of phase from each other. One skilled in the art will recognize that multiplying converted signal 314 by clock signals or square waves may introduce high frequency spectral products into signal 324, 326. However, the high frequency spectral products can be filtered from the signals 324, 326 by integrators 328, 330, respectively, or by low-pass or band-pass filters.

As described above, signal processing portion 306 may also include one or more low pass filters 328, 330. Low pass filters 328, 330 receive modulated signals 324, 326, respectively. In an embodiment, low pass filters 328, 330 may be implemented by integrator circuits. However, this is not a requirement—any type of appropriate low pass filter or band pass filter may be applied to modulated signals 324, 326. The filtered signals 332, 334 may then be fed into a processor circuit 336.

Processor circuit 336 may combine the filtered, quadrature signals 332, 334. The combination of filtered signals 332, 334 may be used to calculate the angle of the magnetic target detected by CVH sensing element 304. For example, as the magnetic target moves around the Hall elements in CVH sensing element 304, the amplitude steps (see, e.g., FIG. 2) of signal 316 will change accordingly. Changes in amplitude steps of signal 316 result in downstream changes in amplitude steps of the modulated quadrature signals 324, 334. When filtered signals 332, 334 are combined in the processor circuit 336, phase changes in the resulting combined signal contain information about the original changes in amplitude steps of signal 316. However, the phase changes in the combined signal may be further processed to determine an estimated angle of the detected magnetic target.

In an embodiment, the combined signal may be a sum or product of quadrature signals 332 and 334. As shown in FIG. 3, the processor circuit 336 can compute an arctangent of the quotient of quadrature signal 334 (represented by "Q") divided by quadrature signal 332 (represented by "I"). Because quadrature signal 332 is modulated with a cosine signal and quadrature signal 334 is modulated with a sine signal, the quotient of quadrature signal 334 divided by quadrature signal 332 may represent the tangent of the signal 316. Thus, the arctangent, or inverse tangent, calculation may produce an output signal 338 that represents the estimated angle of the detected magnetic target. In an embodiment, the arctangent calculation may be performed by an arctangent algorithm such as a CORDIC algorithm. For example, processor circuit 336 may be a processor configured to execute software, firmware, and/or microcode instructions to perform the CORDIC algorithm. In another embodiment, processor circuit 336 may be a custom circuit (such as a circuit that implements a state machine, for example) configured to perform the CORDIC algorithm.

By using quadrature signals and performing the arctangent calculation, the resulting estimated angle signal may have a resolution finer than, and/or accuracy greater than, the angular spacing of the vertical Hall elements in the CVH sensing element 304. In addition to the arctangent calculation, the processor circuit 336 can include an interpolation module (not shown) operable to interpolate the angle of the detected magnetic field to a finer degree than the angles between the Hall elements.

The sigma-delta ADC 310 may be configured so that the converted signal 314 can be written as:

$$f(t) = V_{DC} + \sum_{n \geq 1} A_n [\sin(2\pi f_{CVH} t)\sin(\alpha_n) + \cos(2\pi n f_{CVH} t)\cos\alpha_n] + V_{noise}(t) \quad \text{Equation 1}$$

Where f(t) represents converted signal 314, $\alpha_n$ represents the angle of the detected magnetic field and ($A_n$, $\alpha_n$) represents the harmonic offset components, $V_{DC}$ is the DC offset of the signal, and $V_{noise}$ is the high pass noise (e.g. waveform 402 in FIG. 4) shaped by sigma-delta ADC 310.

Figure 4:
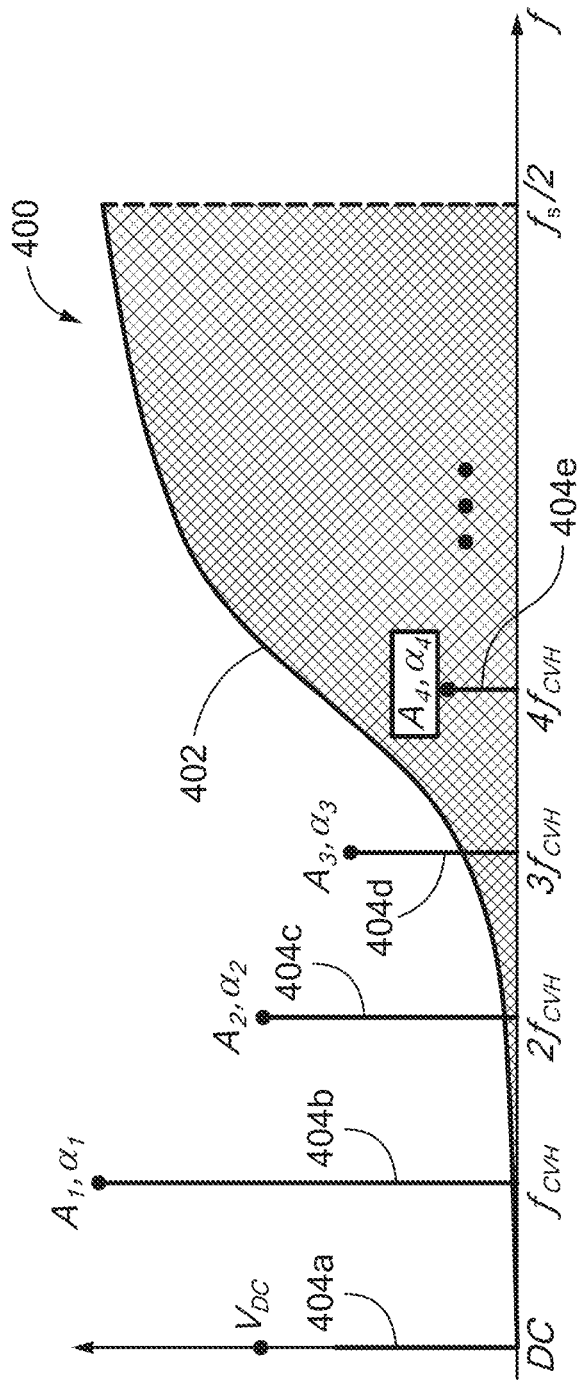
FIG. 4 is a graph showing a frequency spectrum of the output of an analog-to-digital converter that can be generated by the analog-to-digital converter of the magnetic field sensor of FIG. 3.

It is not necessary that a sigma-delta analog-to-digital converter be employed. ADC 310 can be replaced with any type of analog-to-digital converter. However, the sigma-delta ADC 310 has the advantage that it may be implemented in a relatively small silicon area, it can operate to move noise content to higher frequencies as shown in FIG. 4, and it may not be necessary to recover the signal from the sigma-delta bit stream. In other words, because the noise is shifted, it may not be necessary to filter the noise prior to further processing of the signal. In other embodiments, ADC 310 may also be a low-pass or band-pass filtering sigma-delta ADC.

The sigma-delta ADC 310 acquires many samples of the input signal 318 to produce a stream of 1-bit codes. In an embodiment, the sampling frequency of ADC 310 is much higher than the Nyquist frequency. For example, the sample rate may approach or be equal to the frequency of the system clock. The frequency of the system clock may range from less than about 5 MHz to more than about 16 MHz in a typical embodiment.

Figure 3A:
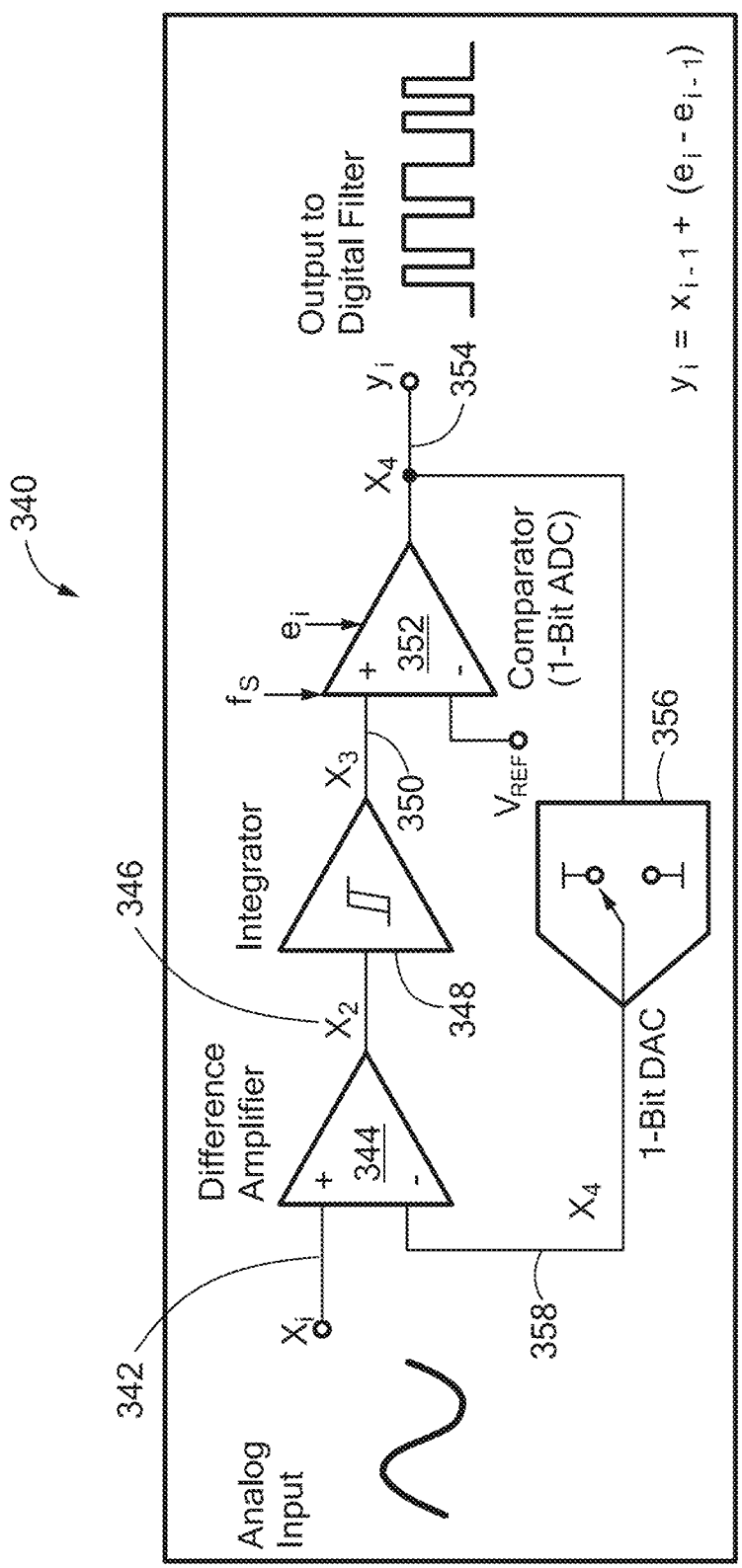
FIG. 3A is a block diagram of an integrator circuit that can be used as the integrator circuit of the magnetic field sensor of FIG. 3.

Referring to FIG. 3A, an implementation of a sigma-delta ADC 340, which may be the same as or similar to ADC 310, receives an analog input signal 342, which may be the same as or similar to signal 318. A difference amplifier 344 compares analog input 342 to previous samples to generate a difference or 'delta' signal 346. An integrator 348 receives delta signal 346 and produces an integrated or 'sigma' signal 350. Signal 350 is compared by comparator 352 to a reference voltage to produce output signal 354. Output signal 354 is fed back into a digital-to-analog converter 356 to be converted into an analog signal 358, which is provided as an input to the difference amplifier 344.

As shown in FIG. 3A, ADC 340 receives an analog input and produces a digital bit-stream output signal 354. The duty cycle of the bit-stream output signal 354 represents the amplitude of the analog input signal 342. For example, when the amplitude of the input signal 342 is high, the duty cycle of the output signal 354 may be high and when the amplitude of the input signal 342 is low, the duty cycle of the output signal 354 may be low, or vice versa.

Figure 3B:
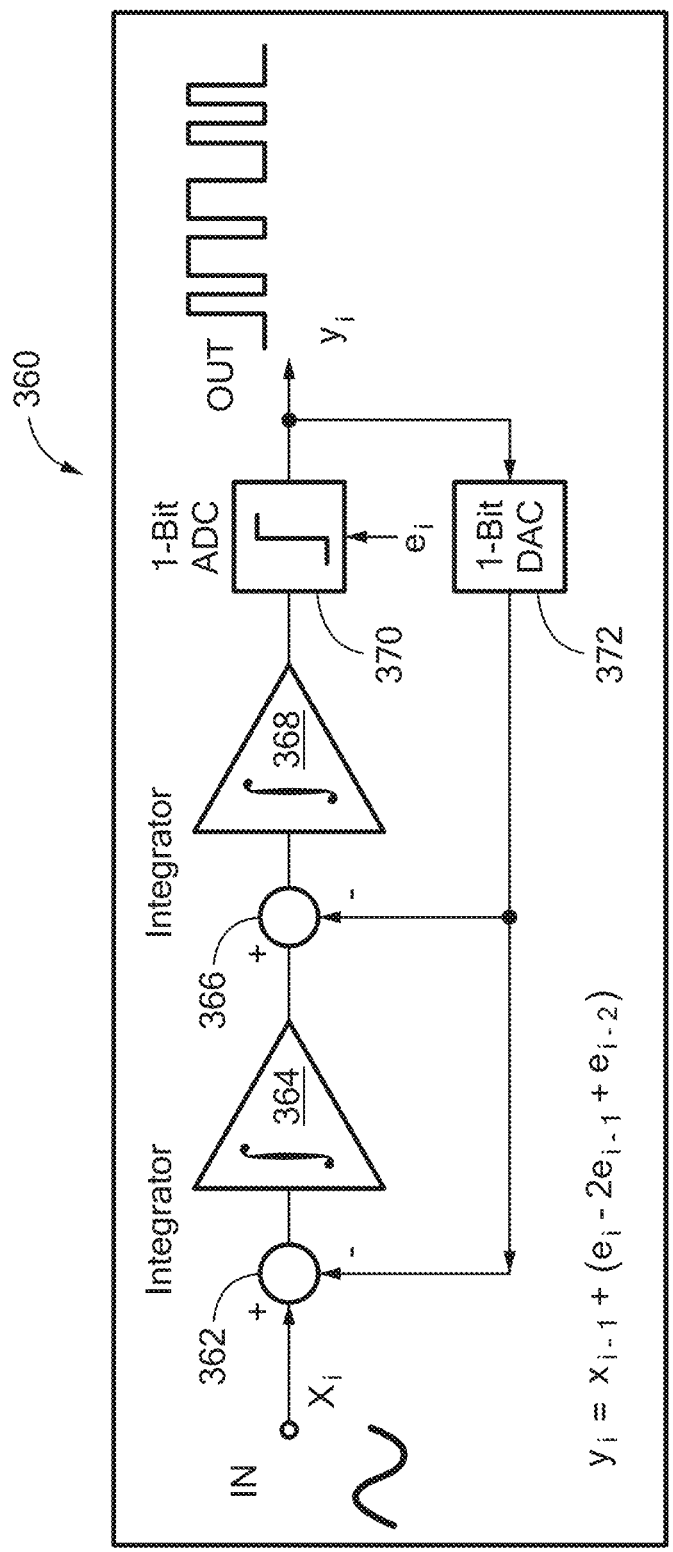
FIG. 3B is a block diagram of another embodiment of an integrator circuit that can be used as the integrator circuit of the magnetic field sensor of FIG. 3.

Referring to FIG. 3B, a second order ADC 360 may be the same as or similar to ADC 310. In the embodiment shown in FIG. 3B, ADC 360 includes a first stage having a difference amplifier 362 and an integrator 364, and a second stage having a second difference amplifier 366 and a second integrator 368. ADC 360 also includes a one-bit analog-to-digital converter 370 and a feedback loop having a one-bit digital-to-analog converter 372. Having two integrator stages may further reduce any in-band quantization noise in the signal caused by the analog-to-digital conversion.

Referring again to FIG. 3, in the embodiment where converted signal 314 is described by Equation 1 above, modulators 320, 322, and filters 328, 330, may be configured so that, after multiplying f(t) of equation (1) by the sin and cosine signals of the modulators 320, 322 and filtering the signal for k CVH cycles, modulated signals 332,334 can be written as:

$$I = \int_0^{kT_{CVH}} f(t) \cdot \cos(2\pi f_{CVH} t) \cdot dt = \quad \text{Equation 2}$$

$$A_1 k \frac{T_{CVH}}{2} \cos(\alpha_1) + \int_0^{kT_{CVH}} V_{noise}(t) \cdot \cos(2\pi f_{CVH} t) \cdot dt \cong$$

$$A_1 k \frac{T_{CVH}}{2} \cos(\alpha_1)$$

$$Q = \int_0^{kT_{CVH}} f(t) \cdot \sin(2\pi f_{CVH} t) \cdot dt = \quad \text{Equation 3}$$

$$A_1 k \frac{T_{CVH}}{2} \sin(\alpha_1) + \int_0^{kT_{CVH}} V_{noise}(t) \cdot \sin(2\pi f_{CVH} t) \cdot dt \cong$$

$$A_1 k \frac{T_{CVH}}{2} \sin(\alpha_1)$$

Where I represents modulated signal 332 and Q represents modulated signal 334. From equations 3 and 4 it can be identified that the I and Q values, 332, 334, respectively, are DC values.

Performing an arctangent operation (i.e. the inverse of a tangent operation) on the quotient of Q divided by I results in an estimated angle of the magnetic field, as follows:

$$\alpha_{est} = \quad \text{Equation 4}$$

$$\tan^{-1}\left(\frac{Q}{I}\right) = \tan^{-1}\left(\frac{A_1 k \frac{T_{CVH}}{2} \sin(\alpha_1)}{A_1 k \frac{T_{CVH}}{2} \cos(\alpha_1)}\right) = \tan^{-1}\left(\frac{\sin(\alpha_1)}{\cos(\alpha_1)}\right) = \alpha_1$$

Referring to FIG. 4, the sigma-delta ADC 310 may act as a noise shaping element, shifting noise in the original signal 316 to higher frequencies. For example, the graph 400 is a frequency spectrum graph illustrating a noise shaping result of the sigma-delta ADC 310. In graph 400, the horizontal axis represents frequency and the vertical axis represents amplitude of converted signal 314. Spectral lines 404a, 404b, 404c, 404d, 404e, etc. are representative of spectral content of the converted signal 314 of FIG. 3. As shown, the converted signal 314 has highest amplitude spectral line 404b at the fundamental frequency f, which is the frequency at which the CVH sensing element 304 of FIG. 3 circulates around the vertical Hall elements of the CVH sensing element 304. The amplitude is lower at DC and at higher harmonics. The noise, however, is shifted by the ADC 310 to higher frequencies, as shown by waveform 402. In an embodiment, the noise is shifted to frequencies substantially above the second and/or third harmonics 404c, 404c of the fundamental frequency f. This noise may subsequently be removed from the modulated signals 324, 326 by a low-pass filter, such as low pass filters 328, 330.

Operation of the modulators 320, 322 of FIG. 2 results in the modulated signals 324, 322 having different spectral content, wherein the spectral line 404b is shifted to DC, but harmonic content remains. In an embodiment, low pass filters 328, 330 may be configured to remove the noise and higher harmonics from modulated signals 324, 326 respectively, so that the resulting filtered signals 332, 334 contain primarily respective DC components.

Figure 5:
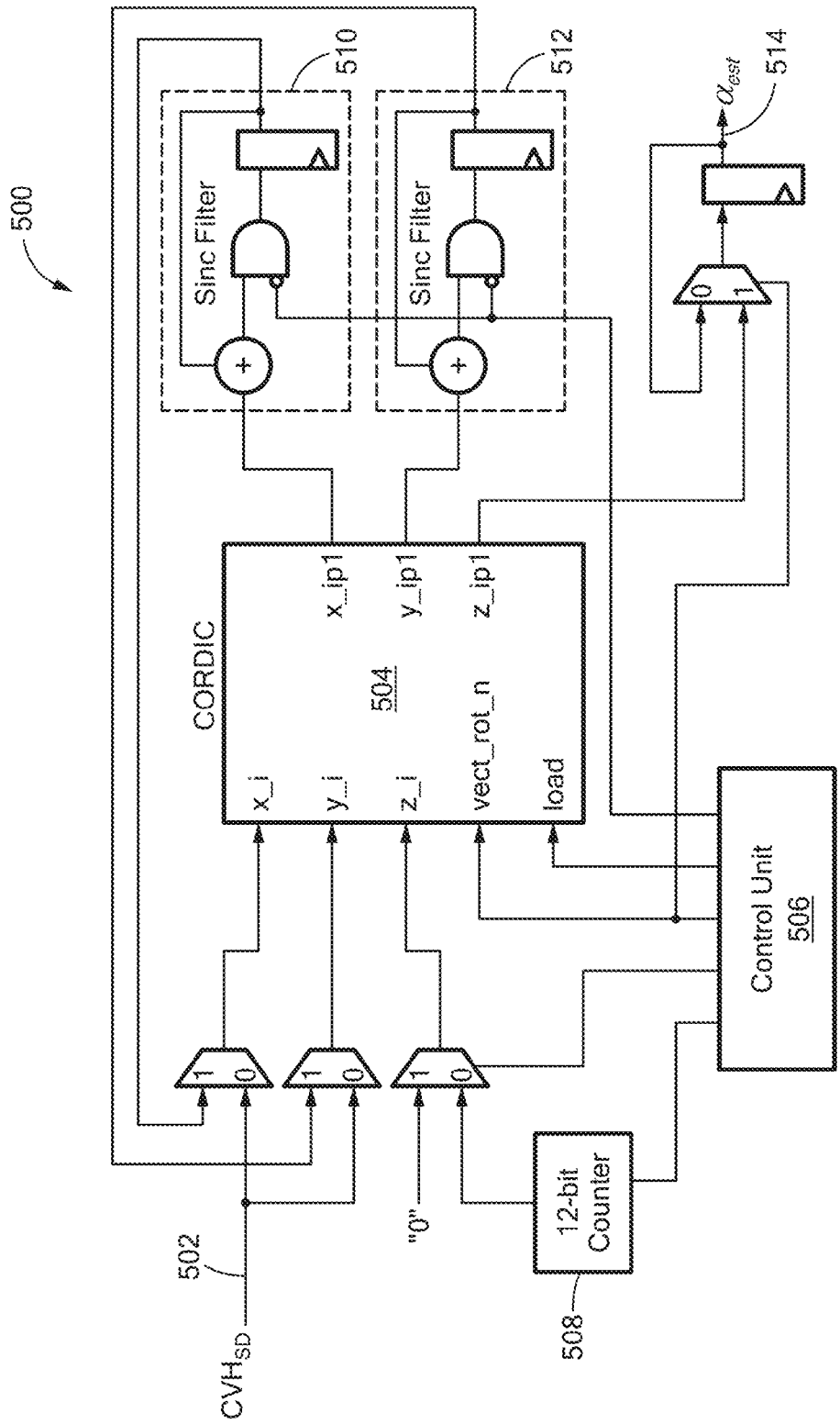
FIG. 5 is a block diagram of a processor circuit that can be used as the processor circuit of the magnetic field sensor of FIG. 3.

Referring to FIG. 5, circuit 500 may perform the arctangent calculation discussed above. Circuit 500 receives signal 502, which may be a combined filtered quadrature signal, e.g., a combination of the filtered signals 332, 334 of FIG. 3. In an embodiment, signal 502 may be the quotient of filtered signal 332 (as modulated with a sine signal) divided by filtered signal 334 (as modulated with a cosine signal).

Processor 504 may be configured to perform the CORDIC algorithm to perform an arctangent function on signal 502. Processor 504 may be a custom circuit, such as a custom-designed IC, a processor having a memory containing/programmed with instructions to perform the CORDIC algorithm, an FPGA or other type of programmable hardware programmed to perform the CORDIC function, etc. Circuit 500 also includes a control unit circuit 506. The control circuit may control the processing flow by sending control signals to processor 504 and surrounding circuitry (such as counter 508, sinc filters 510 and 512, and the various multiplexors, latches, and other circuits shown in FIG. 5). As shown, circuit 500 may include one or more feedback loops to, for example, feedback the output signals of sinc filters 510 and 512 as inputs to processor 504. As processor 504 processes input signal 502, it provides output signal 514 which represents the arctangent of input signal 502.

In an embodiment, processor 504 has a dual functionality as I/Q modulator and an arctangent calculator. Counter 508 represents the phase of the sine and cosine reference signals (used for generating the quadrature components). The signal 502 is multiplied by these sine and cosine signals generated by processor 504. The result of such multiplication pass through filters 510, 512 and, when the reference signal period is finished (as controlled by 506), control unit 506 asserts a control signal that causes processor 504 to begin performing an arctangent function. When the arctangent operation is complete, the arctangent value representing the estimated angle of the target is provided as an output (e.g. signal 514).

The CVH techniques above may produce an output signal (i.e. an estimated angle or location of the magnetic target) each time a CVH cycle is completed. Each CVH cycle consists of a sampling from each of the vertical Hall elements in the CVH sensing element. For example, the CVH sensing element 10 in FIG. 1 is shown having 32 vertical Hall elements. During one CVH cycle, each vertical Hall element is activated sequentially. The resulting signals are concatenated over time to produce signal 316. For example, referring to FIG. 2, graph 200 shows the output CVH sensing element 10 over time. The horizontal axis of graph 200 represents each Hall element in CVH sensing element 10, and the vertical axis represents the magnetic field detected by each sequential vertical Hall element.

Referring to FIG. 3, when a CVH cycle is complete, the signal processing portion 306 can perform an integration over the waveform produced by the CVH cycle to calculate an estimated angle. In such embodiments, the CVH-based sensor may calculate one estimated angle each time a CVH cycle is complete. Thus, to provide an accurate output of the angle, the time to complete the CVH cycle should at least be greater than the Nyquist frequency for sampling the target. As an example, if the target has an expected maximum rotational frequency of F, the sampling frequency of the CVH-based sensor should be at least 2*F, and the corresponding time period T to complete a full CVH cycle should be less than half the rotational period of the magnetic target, or T<1/(2*F).

As an example, assume that CVH sensing element 10 in FIG. 1 and sequencer circuit 312 in FIG. 3 are configured so that a CVH cycle activates Hall element 0, then Hall element 1, then Hall element 2, etc. The cycle may continue sequentially until all 32 Hall elements (numbered 0 to 31 in FIG. 1) have been activated to produce signal 202 in FIG. 2. After or as the 32 samples are acquired, signal processing circuit 306 can process the signal 202 (as described above) to produce an estimated angle in output signal 338.

Figure 6:
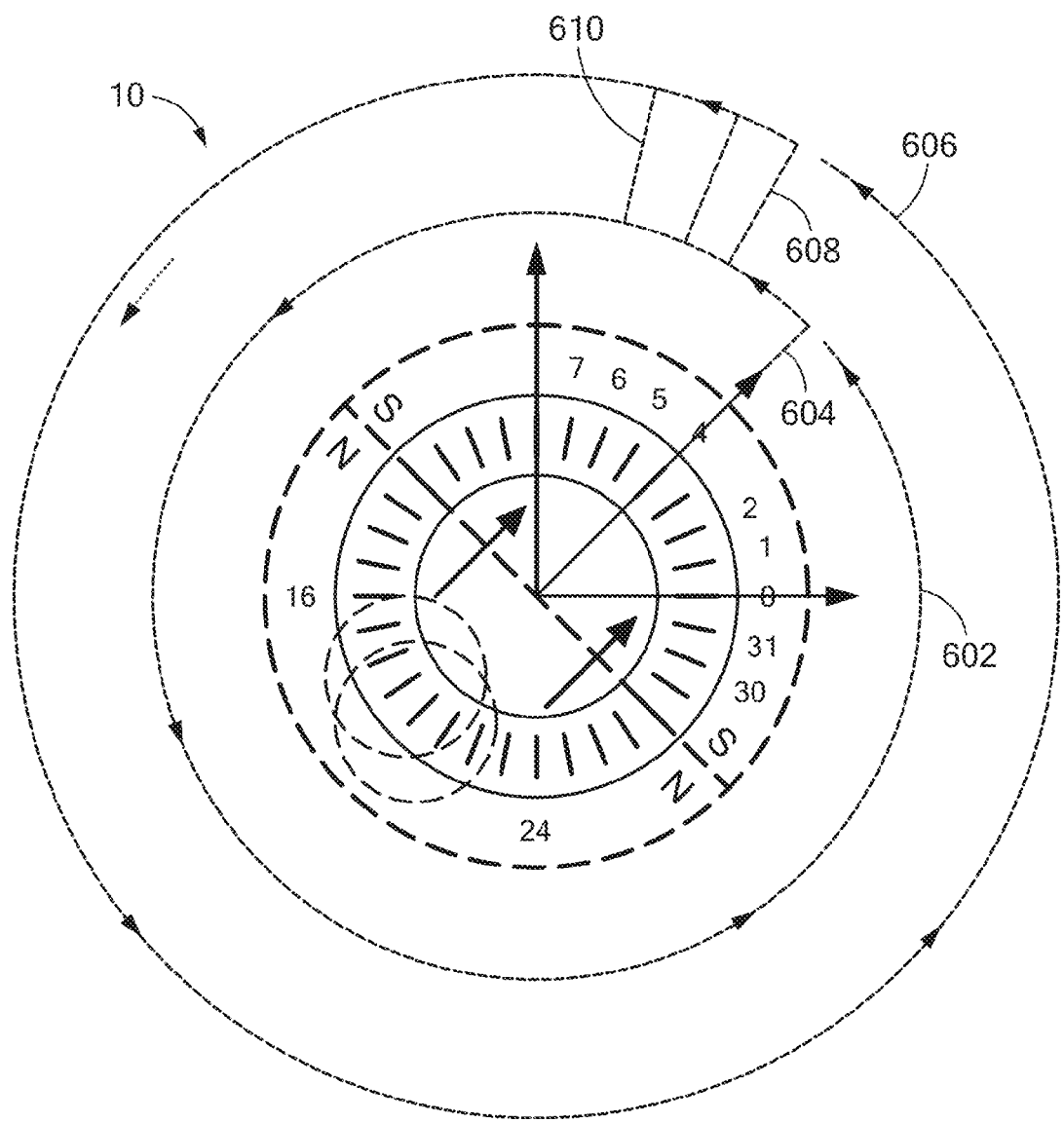
FIG. 6 is a pictorial showing a circular vertical Hall (CVH) and illustrating sliding window integration cycles.

Turning now to FIG. 6, embodiments of the CVH-based magnetic field sensor may implement a windowed integration scheme. The windowed integration scheme may produce an estimated angle on output signal 338 after every N samples taken by the Hall elements in CVH sensing element 10, where the number N is any integer less than or equal to the number of Hall elements in the CVH sensing element 10.

The windowed integration scheme may begin a CVH cycle on any Hall element. As shown in FIG. 6, a first CVH cycle 602 may begin with Hall element 4, as shown by starting line 604. During CVH cycle 602, sequencer circuit 312 may sequentially activate and cause readings to be taken from the Hall elements 4-31, then 0-3, to produce an output signal similar to signal 202 in FIG. 2. (One skilled in the art may recognize that the output signal produced by CVH cycle 602 may be phase-shifted by about 45 degrees with respect to output signal 202 due to CVH cycle 602 starting from Hall element 4 rather than Hall element 0). After CVH cycle 602 completes, the signal processing circuit can produce an estimated angle as an output.

In the next CVH cycle 606, however, it may not be necessary to wait until CVH cycle 602 is complete before updating the output signal with a new estimated angle. Using a windowed integration scheme, a new estimated angle may be produced as soon as a sample is taken from Hall element 5.

The beginning of CVH cycle 606, shown by start line 608, begins with Hall element 5. Just prior to the beginning of CVH cycle 606, during CVH cycle 602, samples were taken from Hall elements 5-31 and then 0-4. Thus, these recent samples, along with the most recent sample from Hall element 5, can be used to perform an integration and produce an estimated angle as the output as soon as the sample from Hall element 5 is taken.

Continuing the example, the next sample may be taken from Hall element 6, as shown by line 610. Just prior to taking the sample from Hall element 6, samples were taken from Hall elements 6-31 then 0-5. Again, these recent samples, along with the most recent sample from Hall element 6, can be used to perform an integration and produce an estimated angle as the output as soon as the sample from Hall element 5 is taken. Accordingly, in this example, the estimated angle at the output signal can be updated every time a sample is taken from a Hall element. Thus, using a windowed integration scheme, the rate of updating the output signal can be increased from 1 update every CVH cycle, to N updates every CVH cycle, where N is the number of Hall elements in CVH sensing element 10.

In other embodiments, using a windowed integration scheme, the CVH-based magnetic field sensor can update the output signal after every m Hall elements have sampled the magnetic field, where m is an arbitrary integer less than the number of Hall elements N. For example, assume m is 4. In this case, the output signal will be updated after every 4 samples are taken from the Hall elements. The first windowed integration cycle may start with Hall element 0 and proceed to take samples from Hall elements 0-31. When the last sample is taken again from Hall element 0, the output signal is updated with the estimated angle.

After updating the estimated angle, the CVH magnetic field sensor may proceed to take samples from Hall elements 1-4. After taking the sample from Hall element 4, the output signal is updated again with a newly estimated angle. The newly estimated angle may be based on an integration of the most recent samples from Hall elements 5-31 and 0-4.

After again updating the estimated angle, the CVH sensor may proceed to take samples from Hall elements 5-8 and, after the sample from Hall element 8 is taken, again update the output signal with a new estimated angle. The CVH sensor may continue this way, providing updated output after every m samples are taken from the Hall elements.

One skilled in the art will recognize that m can be any arbitrary number, and it need not be evenly divisible into the number of Hall elements N.

Figure 7:
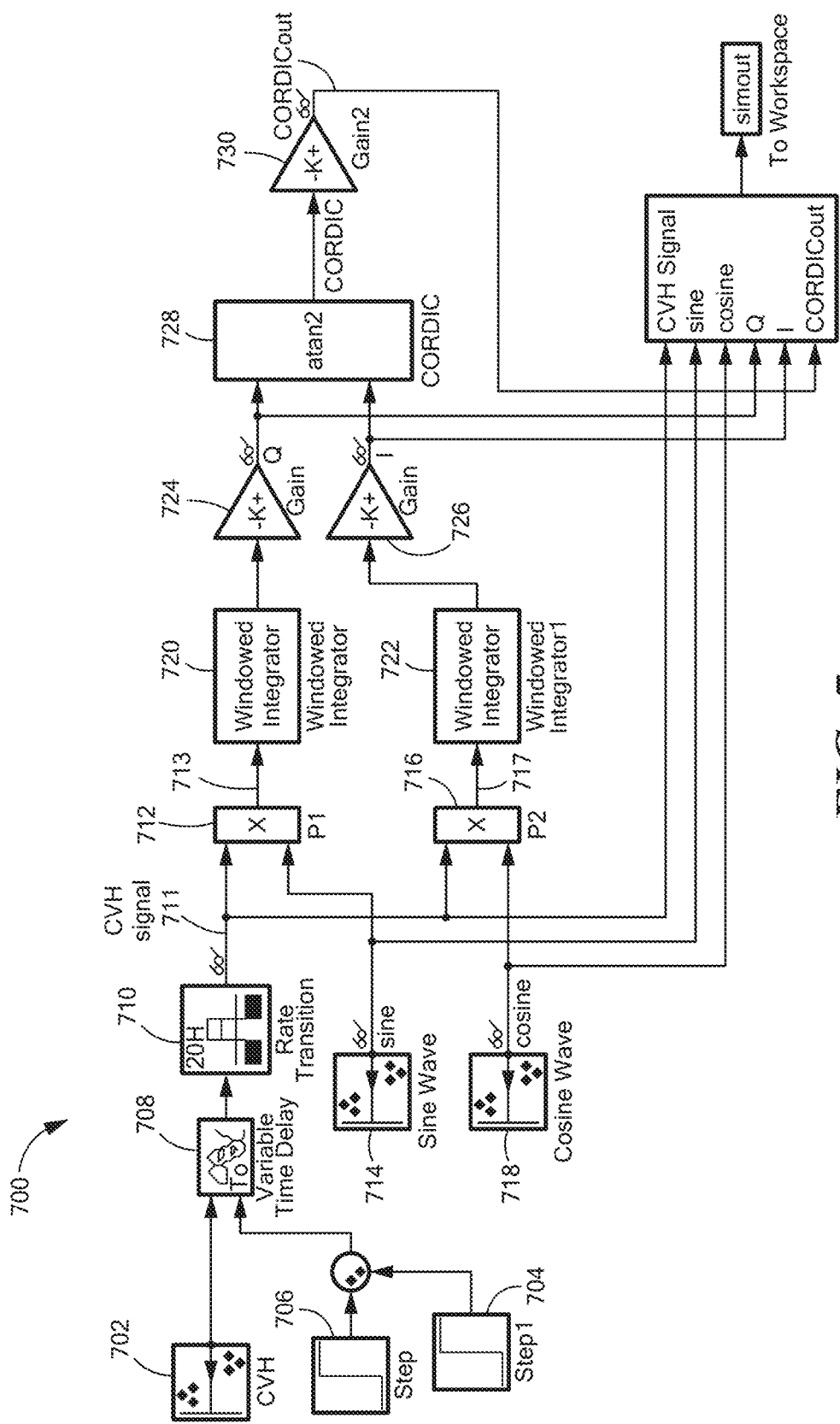
FIG. 7 is a block diagram of an integrator circuit that performs sliding window integration and that circuit that can be used as the integrator circuit of the magnetic field sensor of FIG. 3.

Referring to FIG. 7, a CVH magnetic field sensor 700 may be configured to perform a windowed integration scheme using techniques described above in conjunction with FIG. 6. The CVH magnetic field sensor 700 includes a CVH sensing element 702, which may be the same as or similar to CVH sensing element 10, a variable time delay 708 controlled by control circuits such as circuits 704, 706, and an ADC 710. ADC 710 may be the same as or similar to ADC 310 in FIG. 3.

Converted signal 711 produced by ADC 710 may be the same as or similar to converted signal 314. Modulator 712 may modulate signal 711 with cosine signal 714, and modulator 716 may module signal 711 with sine signal 718, to produce quadrature modulated signals 713, 717, respectively.

Using the sliding window technique described above in conjunction with FIG. 6, modulated signals 713 and 717 may be written as:

$$I = \int_{k\frac{T_{CVH}}{n}}^{(1+\frac{1}{n})kT_{CVH}} f(t) \cdot \cos(2\pi f_{CVH} t) \cdot dt \cong A_1 k \frac{T_{CVH}}{2} \cos(\alpha_1) \quad \text{Equation 5}$$

$$Q = \int_{k\frac{T_{CVH}}{n}}^{(1+\frac{1}{n})kT_{CVH}} f(t) \cdot \sin(2\pi f_{CVH} t) \cdot dt \cong A_1 k \frac{T_{CVH}}{2} \sin(\alpha_1) \quad \text{Equation 6}$$

In equations 5 and 6, f(t) represents digital signal 711, I represents quadrature modulated signal 713, Q represents quadrature modulated signal 717, and n is a multiplier representing the increase in throughput of the output signal.

For example, in a CVH sensing element with 32 Hall elements (N=32), where the output is updated after every 8 samples (m=8), the increase in throughput of the output signal n would be n=m/N=4. Thus, in this example, where an integration is performed after every 8 samples, the throughput of the output signal is increased 4X with respect to a CVH magnetic field sensor that does not use a windowed integration scheme.

Modulated signals 713 and 717 are received by windowed integrators 720 and 722. As noted above, a windowed integration scheme (e.g. using sliding windows of samples from the Hall effect elements) may be employed.

In an embodiment, 'n' in equations 5 and 6 is greater than 1 and may be as large as N, where N is the number of elements in the CVH. In this case, the system will update the output representing the estimated angle of the target n times during one CVH cycle. Each integration may have a window length (e.g. a number of samples that are used to perform the integration) equal to one CVH cycle (i.e. each integration may include N samples where N is the number of elements in a full CVH cycle).

In an embodiment, the system may perform an average of multiple estimated angles in order to provide an averaged estimated angle output. The average may be performed over any number of samples of the estimated angle signal. Recall that n represents the number of times the estimated angle signal is updated in one CVH cycle. If the average is performed over n (or fewer) samples of the estimated angle signal, the averaged estimated angle may be calculated (and/or provided as an output) at a frequency equal to or less than that of the CVH cycle (i.e f(avg)<=1/T$_{CVH}$, where f(avg) is the frequency that the averaged estimated angle is calculated, f(CVH) is the frequency of the CVH cycles or. In other embodiments, the average can be performed over more than n samples of the estimated angle signal. In this case, the frequency of the averaged estimated angle may be greater than the frequency of the CVH cycles.

The outputs of integrators 720 and 722 are amplified by amplifiers 724 and 726, and received by arctangent processing circuit 728. Arctangent processing circuit 728 may be the same as or similar to processor circuit 336 shown in FIG. 3.

The output signal 732 may represent the estimated angle of the magnetic target. As noted above, the output may be updated more frequently than once every CVH cycle. In an embodiment, the output may be updated after every m samples taken by the Hall effect elements in CVH sensing element 702, where m is an arbitrary integer less than or equal to the number of Hall effect elements in CVH sensing element 702.

All references cited in this document are incorporated by reference in their entirety. Having described various embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

The invention claimed is:

1. A magnetic field sensor, comprising:
   a circular vertical Hall (CVH) sensing element comprising a plurality of vertical Hall elements, each vertical Hall element comprised of a respective group of vertical Hall element contacts selected from among a plurality of vertical Hall element contacts, the plurality of vertical Hall element contacts arranged over a common implant region in a semiconductor substrate, adjacent ones of the plurality of contacts at predetermined angles from each other;

a CVH output stage comprising one or more drive circuits to drive the plurality of vertical Hall elements and produce an analog signal representing a strength of an external magnetic field as detected by the plurality of vertical Hall elements;

an analog-to-digital converter coupled to receive the analog signal and produce a digital signal;

a quadrature modulator circuit coupled to the digital signal and operable to generate a plurality of quadrature modulated signals; and a processor stage coupled to receive signals representative of the plurality of quadrature modulated signals and operable to compute an estimated angle of the external magnetic field.

2. The magnetic field sensor of claim 1 wherein the estimated angle has an accuracy greater than the predetermined angle between the vertical Hall element contacts.

3. The magnetic field sensor of claim 1 wherein the analog-to-digital converter is a sigma-delta analog-to-digital converter and the digital signal is a pulse stream.

4. The magnetic field sensor of claim 3 wherein the sigma-delta analog-to-digital converter comprises a noise shaping transform that shifts quantization noise to higher frequencies.

5. The magnetic field sensor of claim 1 wherein the quadrature modulator circuit is configured to modulate the digital signal with a sine signal to produce a first quadrature modulated signal of the plurality of quadrature modulated signals.

6. The magnetic field sensor of claim 5 wherein the quadrature modulator circuit is configured to modulate the digital signal with the sine signal by multiplying the digital signal with a clock or square wave signal.

7. The magnetic field sensor of claim 5 wherein the quadrature modulator circuit is configured to modulate the digital signal with a cosine signal to produce a second quadrature modulated signal of the plurality of quadrature modulated signals.

8. The magnetic field sensor of claim 7 wherein the quadrature modulator circuit is configured to modulate the digital signal with the sine signal by multiplying the digital signal with a first clock or square wave signal and configured to modulate the digital signal with a cosine signal by multiplying the digital signal with a second clock or square wave signal that is ninety degrees out of phase with the first clock signal.

9. The magnetic field sensor of claim 7 wherein the processor stage is configured to filter the first and second quadrature signals.

10. The magnetic field sensor of claim 9 wherein the processor stage is configured to filter the first and second quadrature signals by performing an integration using the first and second quadrature signals.

11. The magnetic field sensor of claim 1 wherein the CVH sensing element further comprises a drive circuit and a switching network having a plurality of connection nodes, wherein a portion of the plurality of connections are coupled to the drive circuit to drive the vertical Hall elements coupled to the connection nodes.

12. The magnetic field sensor of claim 1 wherein the processor stage is configured to perform a sliding integration to produce at least one estimated angle output per CVH cycle.

13. A method of sensing an angle of a magnetic field comprising:

selectively activating one or more drive circuits coupled to one or more of a plurality of vertical Hall elements arranged over a common implant region in a substrate, each vertical Hall element comprised of a respective group of vertical Hall element contacts selected from among a plurality of vertical Hall element contacts, the plurality of vertical Hall element contacts arranged over a common implant region in a semiconductor substrate, adjacent ones of the plurality of contacts at predetermined angles from each other, the selectively activating in order to activate the one or more of the plurality of vertical Hall elements;

providing an analog signal from the one or more activated vertical Hall elements, the signal representing a magnitude of an external magnetic field as detected by the one or more vertical hall elements;

converting the analog signal to a digital signal;

generating a plurality of quadrature modulated signals; and computing an estimated angle of the external magnetic field using the plurality of quadrature modulated signals.

14. The method of claim 13 wherein the estimated angle has an accuracy greater than the predetermined angle between the vertical Hall element contacts.

15. The method of claim 14 wherein converting the analog signal comprises using a sigma-delta analog-to-digital converter to produce an N-bit output stream.

16. The method of claim 13 further comprising shifting noise in the analog signal to higher frequencies.

17. The method of claim 16 wherein shifting the noise comprises converting the analog output stream to the digital signal by processing the signal with a sigma-delta analog-to-digital converter having a noise shaping property.

18. The method of claim 13 further comprising modulating the digital signal with a sine signal to produce a first quadrature modulated signal.

19. The method of claim 18 wherein modulating the digital signal with a sine signal includes multiplying the digital signal with a clock or square wave signal.

20. The method of claim 18 further comprising modulating the digital signal with a cosine signal to produce a second quadrature modulated signal.

21. The method of claim 20 modulating the digital signal with a cosine signal includes multiplying the digital signal with a clock or square wave signal that is ninety degrees out of phase with the sine signal.

22. The method of claim 20 further comprising filtering the first and second quadrature signals.

23. The method of claim 22 wherein filtering the first and second quadrature signals comprises performing an integration using the first and second quadrature signals.

* * * * *

UNITED STATES PATENT AND TRADEMARK OFFICE
CERTIFICATE OF CORRECTION

| | | |
|---|---|---|
| PATENT NO. | : 9,739,847 B1 | Page 1 of 1 |
| APPLICATION NO. | : 15/012125 | |
| DATED | : August 22, 2017 | |
| INVENTOR(S) | : Octavio H. Alpago et al. | |

It is certified that error appears in the above-identified patent and that said Letters Patent is hereby corrected as shown below:

In the Specification

Column 3, Line 41, delete "(CVH) and" and replace with --(CVH) sensing element and--

Column 3, Line 43, delete "and that circuit that can" and replace with --and that can--

Column 6, Line 65, delete "the graph 502" and replace with --the graph 200--

Column 7, Line 3, delete "signal 502" and replace with --signal 202--

Column 8, Line 49-50, delete "signals 324, 334" and replace with --signals 332, 334--

Column 11, Line 9, delete "404c, 404c" and replace with --404c, 404d--

Column 14, Line 33, delete "cycles or. In" and replace with --cycles. In--

Column 14, Line 42, delete "signal 732 may" and replace with --signal may--

Column 14, Line 57, delete "that that scope of" and replace with --that the scope of--

Signed and Sealed this
Tenth Day of July, 2018

Andrei Iancu
*Director of the United States Patent and Trademark Office*